United States Patent
Su

(10) Patent No.: US 7,180,553 B2
(45) Date of Patent: Feb. 20, 2007

(54) DUAL MODE TELEVISION TUNER CAPABLE OF PROCESSING BOTH DIGITAL AND SATELLITE TELEVISION SIGNALS AND METHOD THEREOF

(75) Inventor: Tung-Ming Su, Kao-Hsiung Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 407 days.

(21) Appl. No.: 10/707,520

(22) Filed: Dec. 19, 2003

(65) Prior Publication Data

US 2004/0257479 A1    Dec. 23, 2004

Related U.S. Application Data

(63) Continuation-in-part of application No. 10/604,018, filed on Jun. 22, 2003, now Pat. No. 6,999,747, and a continuation-in-part of application No. 10/707,319, filed on Dec. 4, 2003.

(51) Int. Cl.
 *H04N 5/44* (2006.01)
(52) U.S. Cl. ..................................... 348/731
(58) Field of Classification Search ............... 348/731, 348/725, 726; 455/315, 339
 See application file for complete search history.

(56) References Cited

U.S. PATENT DOCUMENTS

| | | | |
|---|---|---|---|
| 4,320,536 A | 3/1982 | Dietrich | |
| 4,581,643 A * | 4/1986 | Carlson | 348/731 |
| 5,325,129 A | 6/1994 | Henry et al. | |
| 5,517,687 A | 5/1996 | Niehenke et al. | |
| 5,589,791 A | 12/1996 | Gilbert | |
| 5,737,035 A | 4/1998 | Rotzoll | |
| 5,742,357 A | 4/1998 | Griesbaum | |
| 5,802,447 A | 9/1998 | Miyazaki | |
| 5,826,182 A | 10/1998 | Gilbert | |
| 5,847,612 A | 12/1998 | Birleson | |
| 5,950,112 A | 9/1999 | Hori et al. | |
| 6,028,493 A | 2/2000 | Olgaard et al. | |
| 6,029,059 A | 2/2000 | Bojer | |
| 6,091,303 A | 7/2000 | Dent | |
| 6,122,497 A | 9/2000 | Gilbert | |

(Continued)

FOREIGN PATENT DOCUMENTS

CN        1347203 A       5/2002

(Continued)

*Primary Examiner*—Paulos M. Natnael
(74) *Attorney, Agent, or Firm*—Winston Hsu

(57) ABSTRACT

A television receiver includes a digital TV preamp for amplifying a received RF signal within a first frequency range, a satellite TV preamp for amplifying the received RF signal within a second frequency range, a first mixer having inputs coupled to the output of either the digital or satellite TV preamp according to a mode selection signal, a digital TV band-pass filter for filtering the output of the first mixer centered at a first center frequency being selectively coupled to the output of the first mixer according to the mode selection signal, a satellite TV band-pass filter for filtering the output of the first mixer centered at a second center frequency being selectively coupled to the output of the first mixer according to the mode selection signal, and a second mixer stage having inputs coupled to the output of the digital TV filter stage and the satellite TV filter stage.

20 Claims, 4 Drawing Sheets

U.S. PATENT DOCUMENTS

| | | |
|---|---|---|
| 6,127,962 A | 10/2000 | Martinson |
| 6,177,964 B1 * | 1/2001 | Birleson et al. ............ 348/725 |
| 6,243,569 B1 | 6/2001 | Atkinson |
| 6,307,894 B2 | 10/2001 | Eidson et al. |
| 6,370,372 B1 | 4/2002 | Molnar et al. |
| 6,480,236 B1 | 11/2002 | Limberg |
| 6,496,229 B1 | 12/2002 | Limberg |
| 6,724,440 B1 * | 4/2004 | Suan et al. ................ 348/731 |
| 6,724,441 B2 | 4/2004 | Choi |
| 6,725,463 B1 | 4/2004 | Birleson |
| 6,807,405 B1 | 10/2004 | Jagger et al. |
| 6,888,580 B2 * | 5/2005 | Dujmenovic ................ 348/731 |
| 6,934,523 B2 | 8/2005 | Yasuda |
| 6,995,808 B2 * | 2/2006 | Kovacic et al. ............. 348/731 |
| 6,999,747 B2 * | 2/2006 | Su ............................. 455/324 |
| 7,006,162 B2 * | 2/2006 | Cowley et al. ............. 348/731 |
| 7,019,598 B2 * | 3/2006 | Duncan et al. ............. 331/176 |
| 7,019,790 B2 * | 3/2006 | Yamamoto ................. 348/725 |
| 2002/0054651 A1 | 5/2002 | Posti |
| 2005/0235333 A1 | 10/2005 | Bertonis et al. |

FOREIGN PATENT DOCUMENTS

| | | |
|---|---|---|
| KR | 2002030379 A | 4/2002 |

* cited by examiner

DUAL MODE TELEVISION TUNER CAPABLE OF PROCESSING BOTH DIGITAL AND SATELLITE TELEVISION SIGNALS AND METHOD THEREOF

CROSS REFERENCE TO RELATED APPLICATIONS

This is a continuation-in-part of application Ser. No. 10/604,018, filed on Jun. 22, 2003, now U.S. Pat. No. 6,999,747 entitled "Passive Harmonic Mixer" and assigned to the same assignee, the contents of which are incorporated herein by reference. This is also a continuation-in-part of application Ser. No. 10/707,319, filed on Dec. 4, 2003, entitled "Harmonic Mixer Based Television Tuner And Method of Processing a Received RF Signal" and assigned to the same assignee, the contents of which are incorporated herein by reference.

BACKGROUND OF INVENTION

1. Field of the Invention

The invention relates to television tuners, and more particularly, to a dual mode television tuner for processing both satellite TV signals and digital TV signals.

2. Description of the Prior Art

One of the most significant costs in television manufacturing is the cost of the tuner. Furthermore, with the increasing desire to integrate TV functions into personal computer (PC) systems and other electronic devices, the cost of the tuner needs to be reduced. Additionally, television tuners are no longer just used for processing analog TV signals. Satellite TV and digital TV are both increasing in popularity everyday.

Traditionally, tuners have been comprised of two basic components. The first component performs high frequency to intermediate frequency (RF to IF) conversion. Subsequently, the second component performs IF to baseband conversion. The TV tuner was originally designed for broadcast television reception within a television set, which is essentially a stand-alone unit containing a cathode ray picture tube. So, TV tuners were originally integral parts embedded in a single-purpose device.

Presently, however, state-of-the-art consumer electronic devices use TV tuners that are not a built-in part of a television set. The tuner is a separate element that is connected to a cathode ray picture tube at some point, but the tuner is not an integral part of the monitor. As previously mentioned, TV tuners may be fabricated on circuit boards and then installed in personal computer systems, thereby allowing the PC to function as a television set. These tuners convert a radio frequency television signal into a baseband (or low frequency) video signal, which can then be passed on to other elements in the PC for video processing applications.

FIG. 1 shows a highly integrated television tuner 100 on a single microcircuit as disclosed by U.S. Pat. No. 5,737,035. The television tuner 100 includes an adjustable low noise amplifier 101; a first mixer 102; a first local oscillator 104; a band-pass filter 106; a second mixer 108, which is an image rejection type mixer; a second local oscillator 110; a first intermediate frequency amplifier 112; a second band-pass filter 114; and a variable intermediate frequency amplifier 116. However, as the television tuner 100 requires the use of a special image rejection mixer for the second mixer 108, the cost of the tuner is increased. Additionally, the first local oscillator 104 is used in conjunction with the first mixer 102 to up-convert a particular channel selected from an incoming RF signal. This means the first local oscillator 104 must be a variable frequency local oscillator having a large operating frequency range. Because the phase noise over the operating frequency range of the first local oscillator 104 must meet a specific phase noise requirement, typically 84 dBC/Hz, a plurality of VCOs having smaller frequency ranges, and therefore lower phase noise, must be used. Additionally, the television tuner 100 is not capable of processing satellite TV signals. If a device needs to process both digital TV signals and satellite TV signals, a first television tuner for digital TV signals must be used in addition to a second television tuner for satellite TV signals. This increases the overall cost of the device. Accordingly, a need exists for a television tuner having reduced cost and being capable of processing both digital TV signals and satellite TV signals.

SUMMARY OF INVENTION

It is therefore a primary objective of the claimed invention to provide a dual mode television tuner, to solve the above-mentioned problems and process both digital TV signals and satellite TV signals.

According to the claimed invention, a first preamp stage for amplifying and filtering a received RF signal within a first frequency range, a second preamp stage for amplifying and filtering the received RF signal within a second frequency range, a first mixer being selectively coupled to either the first preamp stage or the second preamp stage according to a mode selection signal for generating a first intermediate-frequency signal, a first band-pass filter being selectively coupled to the first mixer according to the mode selection signal for filtering the first intermediate-frequency signal, a second band-pass filter being selectively coupled to the first mixer according to the mode selection signal for filtering the first intermediate-frequency signal, and a second stage being coupled to the first band-pass filter and the second band-pass filter for generating an output signal.

Also according to the present invention, a method is disclosed for processing a received RF signal by a TV tuner, wherein the received RF signal is in at least one of a first frequency range and a second frequency range, the method comprising the following steps: pre-amplifying and filtering the received RF signal to form a pre-amplified signal; selectively mixing the pre-amplified signal with a first local oscillating signal to produce a first intermediate frequency signal, wherein the frequency of the first local oscillating signal is variable and is determined according to the frequency range of the received RF signal; filtering the first intermediate frequency to form a filtered intermediate signal; and selectively mixing the filtered intermediate signal with a second local oscillating signal to produce an output signal, wherein the frequency of the second local oscillating signal is fixed and is determined according to the frequency range of the received RF signal.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
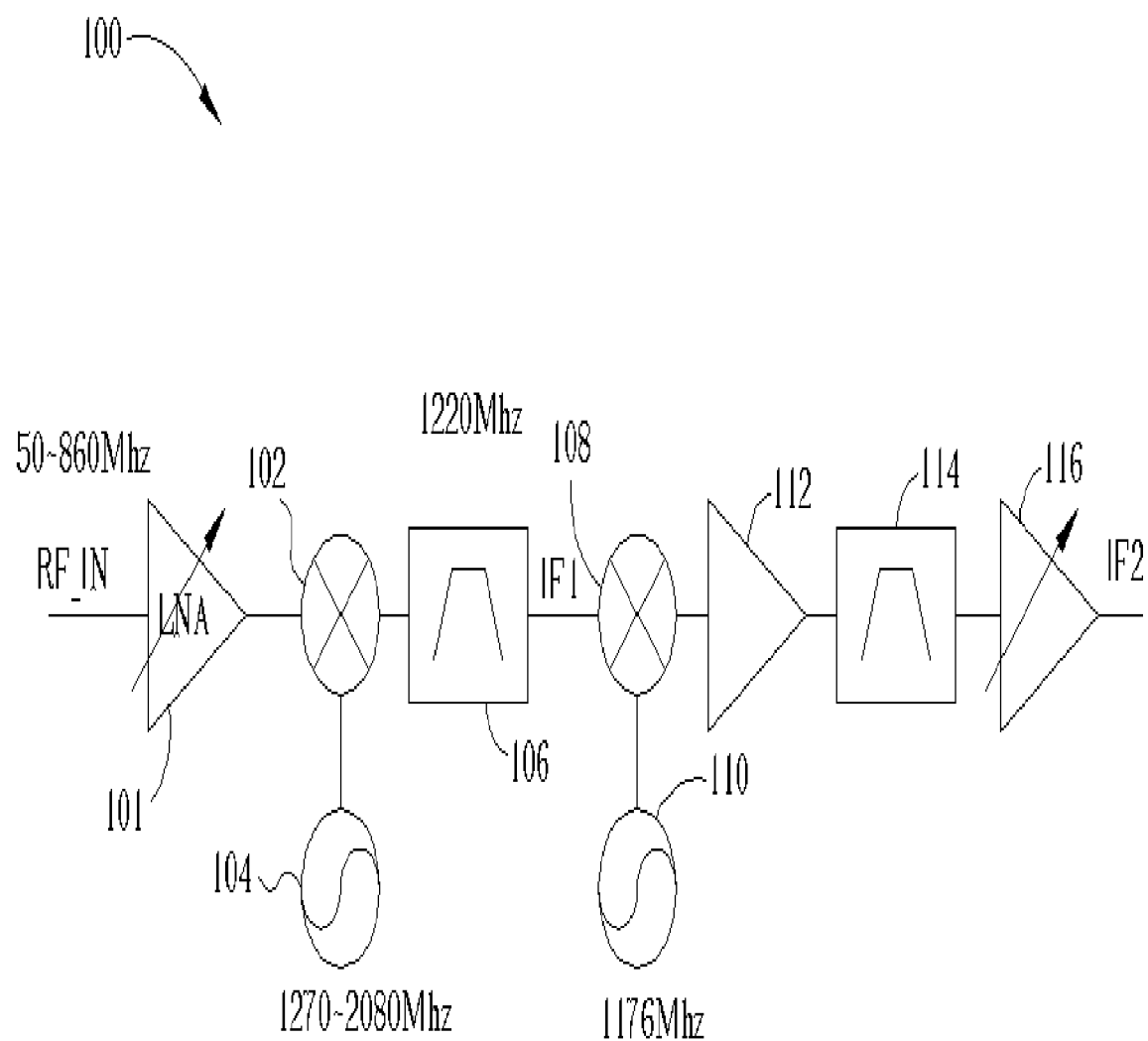
FIG. 1 is an integrated television tuner according to the prior art.
Figure 2:
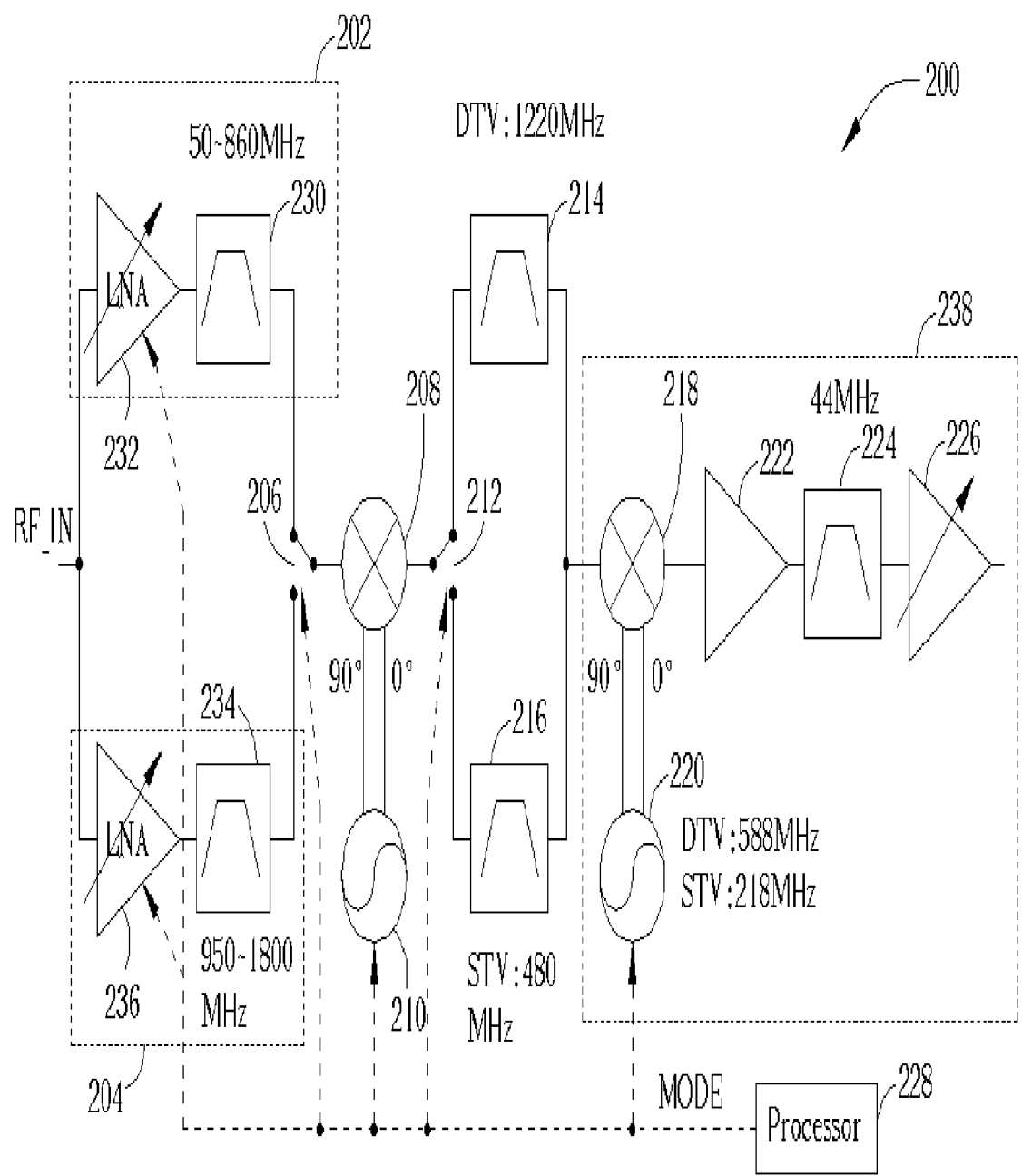
FIG. 2 is a first dual mode television tuner capable of processing both digital and satellite television signals according to a first embodiment of the present invention.

FIG. 2 shows a first dual mode television tuner 200 capable of processing both digital and satellite television signals according to the first embodiment of the present invention. The dual mode television tuner 200 includes a digital TV preamp stage 202 and a satellite TV preamp stage 204. The digital TV preamp stage 202 comprises a digital TV low-noise amplifier 232 and a first digital TV bandpass filter 230. The satellite TV preamp stage 204 comprises a satellite TV low-noise amplifier 236 and a first satellite TV band-pass filter 234. The dual mode television tuner 200 further comprises a first switch 206, a first mixer 208, a first local oscillator 210, a second switch 212, a digital TV band-pass filter 214, a satellite TV band-pass filter 216, a processor 228, and a second stage 238. The first digital TV band-pass filter 230 has a frequency range of 50 MHz to 860 MHz and the second digital TV band-pass filter 214 has a center frequency of 1220 MHz. The first satellite TV band-pass filter 234 has a frequency range of 950 MHz to 1800 MHz and the second satellite band-pass filter 216 has a center frequency of 480 MHz. In the first embodiment of the present invention, the second stage 238 includes a second mixer 218, a second local oscillator 220, an output amplifier 222, a band-pass filter 224, and a variable amplifier 226.

In the preferred embodiment of the present invention, the mixers 208, 218 are implemented as harmonic mixers as shown in FIG. 2. The operation and implementation of the harmonic mixer is explained in application Ser. No. 10/604,018, filed on Jun. 22, 2003, entitled "Passive Harmonic Mixer" and assigned to the same assignee. Because harmonic mixers 208, 218 are used, the first local oscillator 210 and the second local oscillator 220 run at half the frequency that would otherwise be required if non-harmonic mixers were used. The first local oscillator 210 operates at a variable frequency range between 635 MHz to 1140 MHz and provides a 0° phase signal and a 90° phase signal. The second local oscillator 210 operates at a first fixed frequency or a second fixed frequency depending on a mode selection signal and provides a 0° phase signal and a 90° phase signal.

It should also be noted that, although the preferred embodiment of the present invention uses harmonic mixers, non-harmonic mixers can also be used with the present invention. If non-harmonic mixers are used, the operating frequency of the first local oscillator 210 and the second local oscillator 220 will be twice that of the frequencies described for the preferred embodiment of the present invention. Additionally, the local oscillators 210, 220 only need to provide a 0° phase signal.

The operation of the first dual mode TV tuner 200 shown in FIG. 2 is as follows. When the source of the TV signals (RF_IN) is determined (usually by the user), the processor 228 sets the mode selection signal to configure the dual mode TV tuner 200 for the proper operation. If digital TV mode is selected by the processor 228 using the mode selection signal MODE, the digital TV low-noise amplifier 232 is turned on, the satellite TV low-noise amplifier 236 is turned off, the first switch 206 couples the output of the first digital TV preamp stage 202 to the input of the first mixer 208, and the second switch 212 couples the output of the first mixer 208 to the input of the second digital TV band-pass filter 214. In this way, a received radio frequency signal RF_IN is amplified by the digital TV low-noise amplifier 232 and is filtered by the first digital TV band-pass filter 230. The output of the first mixer 208 is a first intermediate signal and has a desired channel in the received RF signal positioned at 1220 MHz, which is the center frequency of the bandwidth of the second digital TV band-pass filter 214. The output of the second digital TV band pass filter 214 is coupled to the input of the second mixer 218. The second local oscillator 220 operates at a constant frequency of 588 MHz and the output of the second mixer 218 is a second intermediate frequency centered at 44 MHz. The second intermediate frequency signal is amplified, filtered, and amplified again by the output amplifier 222, the band-pass filter 224, and the variable amplifier 226, respectively.

Alternatively, if satellite TV mode is selected by the processor 228 using the mode selection signal MODE, the satellite TV low-noise amplifier 236 is turned on, the digital TV low-noise amplifier 232 is turned off, the first switch 206 couples the output of the first satellite TV preamp stage 204 to the input of the first mixer 208, and the second switch 212 couples the output of the first mixer 208 to the input of the second satellite TV band-pass filter 216. In this way, the received radio frequency signal RF_IN is amplified by the satellite TV low-noise amplifier 236 and is filtered by the first satellite TV band-pass filter 234. The output of the first mixer 208 is a first intermediate signal and has a desired channel in the received RF signal positioned at 480 MHz, which is the center frequency of the bandwidth of the second satellite TV band-pass filter 216. The output of the second satellite TV band pass filter 216 is coupled to the input of the second mixer 218. The first local oscillator operates at a constant frequency of 218 MHz and the output of the second mixer 218 is a second intermediate frequency centered at 44 MHz. The second intermediate frequency signal is amplified, filtered, and amplified again by the output amplifier 222, the band-pass filter 224, and the variable amplifier 226, respectively.

Figure 3:
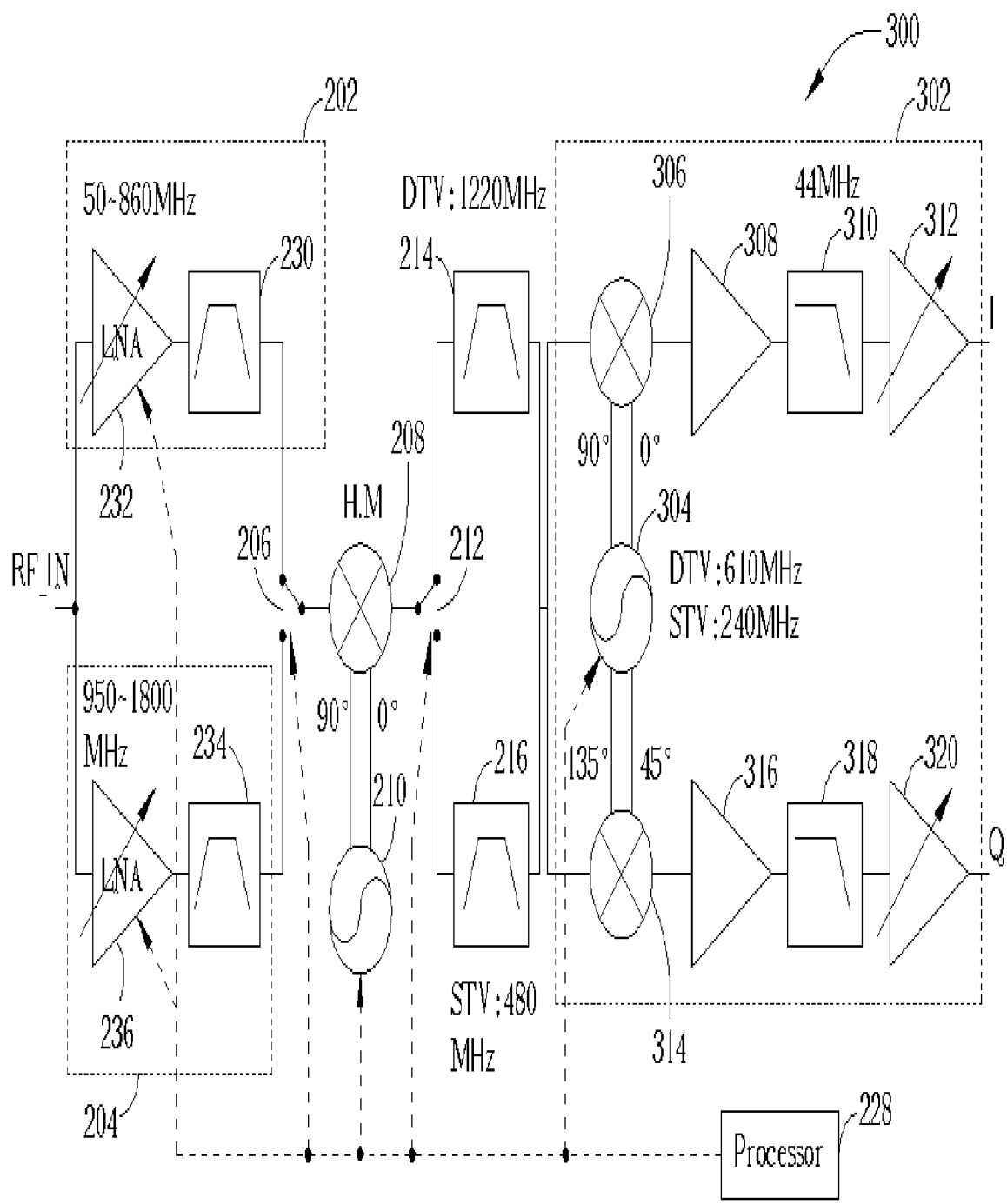
FIG. 3 is a second dual mode television tuner capable of processing both digital and satellite television signals according to a second embodiment of the present invention.

FIG. 3 is a second dual mode television tuner 300 capable of processing both digital and satellite television signals according to the second embodiment of the present invention. The second dual mode television tuner 300 comprises similar components and structure as the first dual mode television tuner 200 shown in FIG. 2. Components having the same operation as already described for FIG. 2 have been shown in FIG. 3 having the same numerical label and a repeated description of these components is hereby omitted. The difference between the first dual mode television tuner 200 shown in FIG. 2 and the second dual mode television tuner 300 shown in FIG. 3 is that the second dual mode television tuner 300 comprises a modified second stage 302. The second stage 302 acts as a direct conversion receiver (DCR) and includes a second local oscillator 304, a second mixer 306, a third mixer 314, an in-phage output amplifier 308, an in-phase low-pass filter 310, an in-phase variable amplifier 312, a quadrature output amplifier 316, a quadrature low-pass filter 318, and a quadrature variable amplifier 320. The operation and implementation of the DCR are explained in application Ser. No. 10/707,319, filed on Dec. 4, 2003, entitled "Harmonic Mixer Based Television Tuner And Method of Processing a Received RF Signal" and assigned to the same assignee If digital TV mode is selected by the processor 228 using the mode selection signal MODE, the second local oscillator 304 operates at a constant second frequency of 610 MHz and provides a 0° phase-delayed reference signal, a 45° phase-delayed reference signal, a 90° phase-delayed reference signal, and a 135° phase-delayed reference signal. The second harmonic mixer 306 mixes the 0° phase-delayed reference signal, the 90° phase-delayed reference signal, and the output of the second digital TV band-pass filter 214 to form an in-phase baseband signal. The in-phase baseband amplifier 308, the in-phase low-pass filter 310, and the in-phase variable amplifier 312 filter and amplify the in-phase baseband signal to produce an in-phase baseband output signal I for processing in later stages in the TV receiver. The third harmonic mixer 314 mixes the 45° phase-delayed reference signal, the 135° phase-delayed reference signal, and the output of the second digital TV band-pass filter 214 to form a quadrature baseband signal. Likewise, the quadrature baseband amplifier 316, the quadrature low-pass filter 318, and the quadrature variable amplifier 320 filter and amplify the quadrature baseband signal to produce an quadrature baseband output signal Q for processing in later stages in the TV receiver. Together, the output I of the in-phase variable amplifier 312 and the output Q of the quadrature variable amplifier 320 form a baseband video signal, which can then passed on to other video processing elements.

If satellite TV mode is selected by the processor 228 using the mode selection signal MODE, the operation of the second mixer stage 302 is the same as for digital TV mode with the exception that the second local oscillator 304 operates at a constant second frequency of 240 MHz and the filtered first intermediate frequency signal is received from the output of the second satellite band-pass filter 216.

Figure 4:
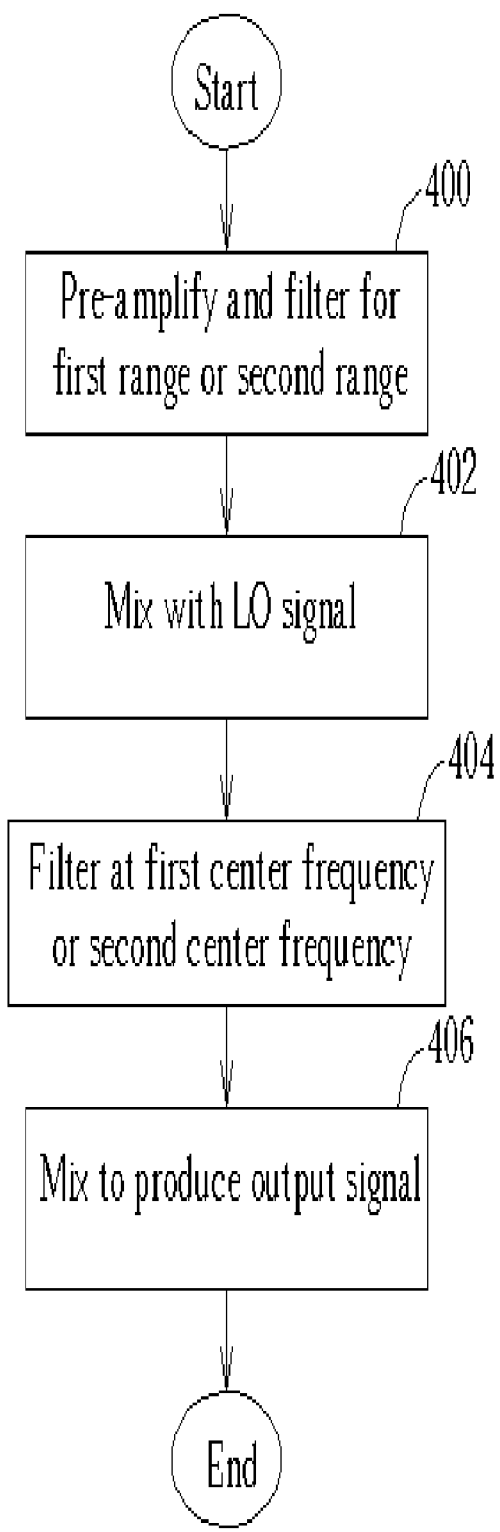
FIG. 4 is a flowchart illustrating a method of processing a received RF signal according to the present invention.

FIG. 4 is a flowchart illustrating a method of processing a received RF signal according to the embodiment of the present invention. The received RF signal can be a digital TV signal or a satellite TV signal. The flowchart includes the following steps:

Step 400: Pre-amplify and filter the received RF signal for a first frequency range or a second frequency range depending on the type of the received RF signal. For digital TV signals, the first frequency range is from 50 MHz to 860 MHz, and for satellite TV signal, the second frequency range is from 950 MHz to 1800 MHz.

Step 402: Mix the output of step 400 with a first reference signal to a particular channel selected from an incoming RF signal and produce a first intermediate signal. When using a harmonic mixer to perform step 402, the first reference signal is variable between 635 MHz to 1140 MHz.

Step 404: Band-pass filter the first intermediate signal centered at a first center frequency or a second center frequency depending on the type of the received RF signal. For digital TV signals, the center frequency is 1220 MHz, and for satellite TV signals, the center frequency is 480 MHz.

Step 406: Mix the output of step 404 with a second reference signal to produce an output signal. As previously mentioned, step 406 may involve a single mixer wherein the output signal is a second intermediate signal. Alternatively, step 406 may involve an in-phase mixer and a quadrature mixer wherein the output signal is a baseband signal. The frequency of the second reference signal depends on the type of the received RF signal. In a first embodiment having a second intermediate frequency output signal using a harmonic mixer, the second reference signal is 588 MHz for digital TV signals and 218 MHz for satellite TV signals. In another embodiment having a baseband output signal using dual harmonic mixers, the second reference signal is 610 MHz for digital TV signals and 240 MHz for satellite TV signals.

Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A television (TV) tuner comprising:
   a first preamp stage for amplifying and filtering a received RF signal within a first frequency range;
   a second preamp stage for amplifying and filtering the received RF signal within a second frequency range;
   a first mixer being selectively coupled to either the first preamp stage or the second preamp stage according to a mode selection signal for generating a first intermediate-frequency signals;
   a first band-pass filter being selectively coupled to the first mixer according to the mode selection signal for filtering the first intermediate-frequency signal;
   a second band-pass filter being selectively coupled to the first mixer according to the mode selection signal for filtering the first intermediate-frequency signal; and
   a second stage being coupled to the first band-pass filter and the second band-pass filter for generating an output signal.

2. The TV tuner of claim 1, further comprising a first local oscillator for providing a first local oscillating signal to the first mixer, wherein the frequency of the first local oscillating signal is variable and is determined according to the frequency range of the received RF signal.

3. The TV tuner of claim 2, wherein the first mixer is a harmonic mixer and the first local oscillating signal further includes a first reference signal and a second reference signal being the first reference signal phase shifted by 90 degrees.

4. The TV tuner of claim 1, wherein the second stage includes a second mixer for mixing the first intermediate-frequency signal to generate a second intermediate-frequency signal.

5. The TV tuner of claim 4, further comprising a second local oscillator for providing a second local oscillating signal to the second mixer, wherein the frequency of the second local oscillating signal is fixed and is determined according to the frequency range of the received RF signal.

6. The TV tuner of claim 5, wherein the second mixer is a harmonic mixer and the second local oscillating signal further includes a third reference signal and a fourth reference signal, the fourth reference signal being the third reference signal phase shifted by 90 degrees.

7. The TV tuner of claim 1, wherein the second stage includes a second mixer for mixing the first intermediate-frequency signal to generate an in-phase baseband signal and a third mixer for mixing the first intermediate-frequency signal to generate a quadrature-phase baseband signal.

8. The TV tuner of claim 7, wherein the second stage further includes a second local oscillator for providing a third local oscillating signal to the second mixer and a fourth local oscillating signal to the third mixer, wherein the frequency of the third and the fourth local oscillating signals is fixed and is determined according to the frequency range of the received RF signal and the fourth local oscillating signal is the third local oscillating signal phase shifted by 90 degrees.

9. The TV timer of claim 8, wherein the second and the third mixers are harmonic mixers, the third local oscillating signal further includes a fifth reference signal and a sixth reference signal, and the fourth local oscillating signal further includes a seventh reference signal and a eighth reference signal, wherein the sixth reference signal is the fifth reference signal phase shifted by 90 degrees, the seventh reference signal is the fifth reference signal phase shifted by 45 degrees, and the eighth reference signal is the fifth reference signal phase shifted by 135 degrees.

10. A method of processing a received RF signal by a television (TV) tuner, comprising:

generating a mode selection signal;

generating a first amplified signal by amplifying and filtering the received RF signal within a first frequency range when the mode selection signal indicates a first mode;

generating a second amplified signal by amplifying and filtering the received RF signal within a second frequency range when the mode selection signal indicates to a second mode;

generating a first intermediate-frequency signal according to the first amplified signal or the second amplified signal;

generating a first filtered signal by filtering the first intermediate-frequency signal according to a first center frequency when the mode selection signal indicates to the first mode;

generating a second filtered signal by filtering the first intermediate-frequency signal according to a second center frequency when the mode selection signal indicates to the second mode; and generating an output signal according to the first filtered signal or the second filtered signal.

11. The method of claim 10, wherein the step of generating the first intermediate-frequency signal comprises:

mixing the first amplified signal or the second amplified signal according to a first local oscillating signal and thereby generating the first intermediate-frequency signal.

12. The method of claim 10, wherein the step of generating the first intermediate-frequency signal comprises:

harmonically mixing the first amplified signal or the second amplified signal according to a plurality of reference signals and thereby generating the first intermediate-frequency signal.

13. The method of claim 10, wherein the step of generating the output signal comprises:

mixing the first filtered signal or the second filtered signal according to a second local oscillating signal and thereby generating the output signal.

14. The method of claim 13, wherein the frequency of the second local oscillating signal is fixed.

15. The method of claim 10, wherein the step of generating the output signal comprises:

harmonically mixing the first filtered signal or the second filtered signal according to a plurality of reference signals and thereby generating the output signal.

16. The method of claim 10, wherein the output signal comprises an in-phase baseband signal and a quadrature-phase baseband signal.

17. The method of claim 10, wherein the first mode is a digital TV mode.

18. The method of claim 17, wherein the second mode is a satellite TV mode.

19. The method of claim 10, wherein the first frequency range is different from the second frequency range.

20. The method of claim 19, wherein the first center frequency is different from the second center frequency.

* * * * *